US012542561B2

(12) United States Patent
Wang et al.

(10) Patent No.: US 12,542,561 B2
(45) Date of Patent: Feb. 3, 2026

(54) CIRCUIT AND METHOD FOR CHANNEL RANDOMIZATION BASED ON TIME-INTERLEAVED ADC

(71) Applicant: Chongqing GigaChip Technology Co., Ltd., Chongqing (CN)

(72) Inventors: Yizhou Wang, Chongqing (CN); Lu Liu, Chongqing (CN); Daiguo Xu, Chongqing (CN); Can Zhu, Chongqing (CN); Hequan Jiang, Chongqing (CN); Ruzhang Li, Chongqing (CN); Jianan Wang, Chongqing (CN); Guangbing Chen, Chongqing (CN); Dongbing Fu, Chongqing (CN); Zhou Yu, Chongqing (CN); Zhengping Zhang, Chongqing (CN)

(73) Assignee: Chongqing GigaChip Technology Co., Ltd., Chongqing (CN)

( * ) Notice: Subject to any disclaimer, the term of this patent is extended or adjusted under 35 U.S.C. 154(b) by 151 days.

(21) Appl. No.: 18/603,189

(22) Filed: Mar. 12, 2024

(65) Prior Publication Data

US 2024/0223203 A1 Jul. 4, 2024

Related U.S. Application Data

(63) Continuation of application No. PCT/CN2021/133566, filed on Nov. 26, 2021.

(30) Foreign Application Priority Data

Nov. 18, 2021 (CN) ......................... 202111369410.X

(51) Int. Cl.
*H03M 1/00* (2006.01)
*H03M 1/12* (2006.01)

(52) U.S. Cl.
CPC .......... *H03M 1/121* (2013.01); *H03M 1/1245* (2013.01)

(58) Field of Classification Search
CPC ...... H03M 1/121; H03M 1/1245; H03M 1/12; H03M 1/1205
USPC .................................................. 341/141, 155
See application file for complete search history.

(56) References Cited

U.S. PATENT DOCUMENTS

| 9,793,910 | B1 | 10/2017 | Devarajan | |
|---|---|---|---|---|
| 2015/0381193 | A1* | 12/2015 | Qiu | ...................... H03M 1/1033 341/118 |
| 2020/0343899 | A1* | 10/2020 | Wu | ...................... H03M 1/0673 |

FOREIGN PATENT DOCUMENTS

| CN | 102769468 A | 11/2012 |
|---|---|---|
| CN | 104038226 A | 9/2014 |
| CN | 110289859 A | 9/2019 |

* cited by examiner

*Primary Examiner* — Peguy Jean Pierre

(57) ABSTRACT

A circuit for channel randomization based on time-interleaved ADC includes: a channel selection module for outputting M clock reception control signals and encoded N data reception control signals based on a main clock and a generated random number; a multi-phase clock distribution module for generating N multi-phase clocks according to a sampling main clock, redistributing the multi-phase clocks according to the clock reception control signals, and outputting M redistributed clock signals; a time-interleaved ADC module for outputting M output data and a corresponding number of channel quantization completion signals according to the redistributed clock signals; an adjustable delay module for setting a delay length for the data reception control signals; and a timing distribution control module for controlling, according to delayed data reception control signals and the channel quantization completion signals, the output data to be output sequentially in chronological order.

14 Claims, 13 Drawing Sheets

| Corresponding Relationship of Channel Status Register | | Corresponding Relationship of Clock Status Register | |
|---|---|---|---|
| Address 1 → | CH1_CLK_CONTROL<N:1> | Address 1 → | CH1_DATA_CONTROL<K:1> |
| CLK1 | 00000...001 (N Bits) | CHANNEL1 | 00..01 (K Bits) |
| CLK2 | 00000...010 (N Bits) | CHANNEL2 | 00..10 (K Bits) |
| CLK3 | 00000...100 (N Bits) | CHANNEL3 | 00..11 (K Bits) |
| ⋮ | ⋮ | ⋮ | ⋮ |
| CLKN | 10000...000 (N Bits) | | |
| NOCLK | 00000...000 (N Bits) | | |

CIRCUIT AND METHOD FOR CHANNEL RANDOMIZATION BASED ON TIME-INTERLEAVED ADC

CROSS REFERENCE TO RELATED APPLICATION

The present disclosure is a continuation application of PCT Application Serial No. PCT/CN2021/133566, filed on Nov. 26, 2021, which claims the priority to a Chinese Application No. CN202111369410.X, filed on Nov. 18, 2021, the contents of all of which are incorporated herein by reference in their entirety for all purposes.

TECHNICAL FIELD

The present disclosure relates to the technical field of an analog-to-digital converter, and in particular, to a circuit and a method for channel randomization based on time-interleaved ADC (Analog-to-Digital Converter).

BACKGROUND

In recent years, with the continuous development of integrated circuit manufacturing technology and 5G technology, there has been an increasing demand for ultra-high-speed and high-precision high-performance ADCs in the military and civilian fields. In order to achieve ultra-high-speed (above 1 GHz sampling rate) and high resolution (10 Bit or above) ADCs, the time-interleaved structure has gradually become the preferred structure of designers due to its simple principle and excellent performance. It improves the overall sampling rate of the ADC by time-division multiplexing in channel order.

The time-interleaved structure can greatly increase the sampling rate. Due to the characteristics of the integrated circuit process, each channel in the multi-channel interleaved structure may not be completely identical.

SUMMARY

The present disclosure proposes a circuit and a method for channel randomization based on time-interleaved ADC.

Exemplary embodiments of the present disclosure proposed a circuit for channel randomization based on time-interleaved ADC. The circuit includes: a channel selection module configured to output M clock reception control signals and encoded N data reception control signals according to a main clock and a generated random number, wherein M and N are positive integers, and M is greater than N; a multi-phase clock distribution module configured to generate N multi-phase clocks according to a sampling main clock, redistribute the multi-phase clocks according to the clock reception control signals, and output M redistributed clock signals; a time-interleaved ADC module configured to output M output data and a corresponding number of channel quantization completion signals according to the redistributed clock signals; an adjustable delay module configured to set a delay length for the data reception control signals; and a timing distribution control module connected to an output end of the adjustable delay module and an output end of the time-interleaved ADC module, respectively, and configured to control, according to delayed data reception control signals and the channel quantization completion signals, the output data to be output sequentially in a chronological order.

In exemplary embodiments, the channel selection module includes: a pseudo-random number generation circuit and a channel selection circuit.

In exemplary embodiments, the pseudo-random number generation circuit is configured to receive the main clock and a set of random number output enablement signals and output a set of random number output signals. In exemplary embodiments, the channel selection circuit is configured to receive the random number output signals and the main clock, and output the clock reception control signals and the data reception control signals.

In exemplary embodiments, the channel selection circuit includes: a clock status register, wherein the clock status register has N addresses, each address represents a multi-phase clock, and a value stored in each address represents a channel connected by the multi-phase clock of a corresponding address; a channel status register having M addresses, wherein each address represents a channel, and the value stored in each address represents a multi-phase clock connected by the channel of a corresponding address; and an idle channel register configured to store a channel that is not connected to any multi-phase clock.

In exemplary embodiments, when the main clock comes, it is determined according to the random number output signals whether to exchange the channel stored in a currently processed address in the clock status register with the channel stored in the idle channel register; the channel status register exchanges the values stored in the corresponding addresses according to the exchange result between the clock status register and the idle channel register; and a corresponding clock reception control signal is output according to the value stored in the channel status register, and at the same time, the data reception control signal is output according to the value stored in the clock status register.

In exemplary embodiments, when the random number output signal is at a high level, an exchange is performed between the channel stored in the corresponding address in the clock status register and the channel stored in the idle channel register.

In exemplary embodiments, when the random number output signal is at a low level, no exchange action is performed between the channel stored in the corresponding address in the clock status register and the channel stored in the idle channel register.

In exemplary embodiments, it is assumed that each of the data reception control signals includes K-bit binary-coded signals, then $2^K$ is greater than or equal to M.

In exemplary embodiments, the multi-phase clock distribution module includes: a multi-phase clock generation circuit and a clock redistribution transmission gate array circuit.

In exemplary embodiments, the multi-phase clock generation circuit includes N D flip-flops connected in a cascaded structure, and an output end of the last D flip-flop is connected to an input end of the first D flip-flop to form a loop, and the output end of each D flip-flops outputs a multi-phase clock corresponding to a different channel.

In exemplary embodiments, the clock redistribution transmission gate array circuit includes M output ends, each of the M output ends includes M transmission switches connected in parallel, each of the M transmission switches includes an input end, an output end, and a control end, the input end of the transmission switch receives one of the multi-phase clocks as input, the control end of the transmission switch receives one bit of the clock reception control signal of the corresponding channel.

In exemplary embodiments, the transmission switch includes: a transmission gate and an inverter.

In exemplary embodiments, the transmission gate includes a PMOSFET and an NMOSFET, where a source of the PMOSFET and a source of the NMOSFET are short-circuited as the input end of the transmission gate, a drain of the PMOSFET and a drain of the NMOSFET are short-circuited as the output end of the transmission gate, and a gate of the NMOSFET serves as the control end of the transmission gate to receive the clock reception control signal, In exemplary embodiments, an input end of the inverter receives the clock reception control signal, and a gate of the PMOSFET is connected to an output end of the inverter.

In exemplary embodiments, the time-interleaved ADC module includes M time-interleaved ADC circuits, and each of the M time-interleaved ADC circuits is configured to output the output data and the channel quantization completion signal of a channel.

In exemplary embodiments, when the redistribution clock input to the current time-interleaved ADC circuit is at a high level: if the channel quantization completion signal of the current time-interleaved ADC circuit is at a low level, the current time-interleaved ADC circuit has not completed quantization, and if the channel quantization completion signal of the current time-interleaved ADC circuit is at a high level, the current time-interleaved ADC circuit has completed quantization.

In exemplary embodiments, the adjustable delay module includes a plurality of delay units, and each input signal is connected to one of the delay units. In exemplary embodiments, the delay unit includes: a first inverter, a second inverter, S delay control NMOSFETs, and S delay capacitors, where S corresponds to the number of bits of a delay control word input to the delay unit. In exemplary embodiments, an output end of the first inverter is connected to an input end of the second inverter, an output end of the second inverter serves as an output end of a corresponding delay unit, an input end of the first inverter serves as an input end of the corresponding delay unit, the delay control NMOSFETs are connected in parallel, and a drain of each delay control NMOSFET is connected to a connection path between the output end of the first inverter and the input end of the second inverter through a delay capacitor, and a gate of each delay control NMOSFET is connected to one bit of the delay control word.

In exemplary embodiments, the timing distribution control module includes: a channel addressing decoder circuit, a data redistribution transmission gate array circuit, and a data outputting D flip-flop circuit.

In exemplary embodiments, the channel addressing decoder circuit is configured to decode the delayed data reception control signals into thermometer code signals with M bits.

In exemplary embodiments, the data redistribution transmission gate array circuit is configured to output redistributed output data and redistributed channel quantization completion signals according to decoded data reception control signals, the output data of the time-interleaved ADC module, and the channel quantization completion signals.

In exemplary embodiments, the data outputting D flip-flop circuit is configured to use the redistributed output data as input and use the redistributed channel quantization completion signals as clock to output reordered output data.

In exemplary embodiments, the data redistribution transmission gate array circuit includes an array of transmission switches, and the transmission switch includes an input end, an output end, and a control end. Each input signal corresponds to a transmission switch. Each data bit of the output data of each time-interleaved ADC module is connected to the input end of a transmission switch. Each decoded data reception control signal is connected to the control ends of R transmission switches, where R is the number of bits of the output data. Each channel quantization completion signal of the time-interleaved ADC module is connected to the input end of a transmission switch, and each decoded data reception control signal is connected to the control end of a corresponding transmission switch. The output end of the transmission switch outputs the redistributed output data or the redistributed channel quantization completion signal.

In exemplary embodiments, the data outputting D flip-flop circuit includes N groups of flip-flop arrays, each group of flip-flop arrays includes R D flip-flops, an input end of each D flip-flop receives one bit of the redistributed output data as input, each group of the flip-flop array receives a redistributed channel quantization completion signal as input of a clock end, and an output end of each group of the flip-flop array outputs the reordered output data.

In exemplary embodiments, the main clock and the sampling main clock have the same frequency; or the frequency of the main clock is one X-th of the sampling main clock, and X and the number of remaining channels after redundant channels are removed are coprime, where X is a positive integer.

Exemplary embodiments of the present disclosure proposed a method for channel randomization based on time-interleaved ADC. The method includes: outputting M clock reception control signals and encoded N data reception control signals according to a main clock and a generated random number, where M and N are positive integers, and M is greater than N; generating N multi-phase clocks according to a sampling main clock, redistributing the multi-phase clocks according to the clock reception control signals, and outputting M redistributed clock signals; outputting M output data and a corresponding number of channel quantization completion signals according to the redistributed clock signals; and setting a delay length for the data reception control signals, and controlling, according to delayed data reception control signals and the channel quantization completion signals, the output data to be output sequentially in a chronological order.

DESCRIPTION OF EMBODIMENTS

By specific examples, the embodiments of the present disclosure are illustrated. Those skilled in the art can easily understand other advantages and effects of the present disclosure from the content disclosed in this specification. The present disclosure can also be implemented or applied through other different specific embodiments. Various details in this specification can also be modified or changed in various ways based on different viewpoints and applications without departing from the spirit of the present disclosure. It should be noted that, as long as there is no conflict, the following embodiments and the features in the embodiments can be combined with each other.

It should be noted that the diagrams provided in the following embodiments only illustrate the basic concept of the present disclosure in a schematic manner, and the drawings only show the components related to the present disclosure and the number, shape, and scale of the components may not be drawn according to actual implementation. During actual implementation, the type, quantity, and scale of each component may be arbitrarily changed, and the layout of the components may also be more complex.

Figure 1:
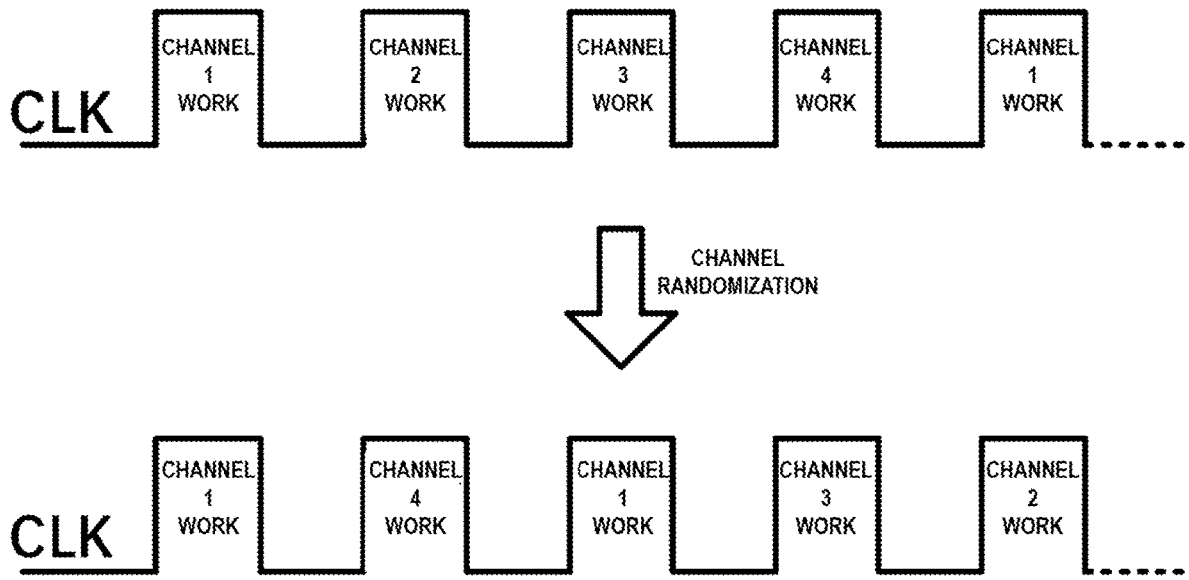
FIG. 1 is a schematic diagram of channel randomization in exemplary embodiments of the present disclosure.
Figure 2:
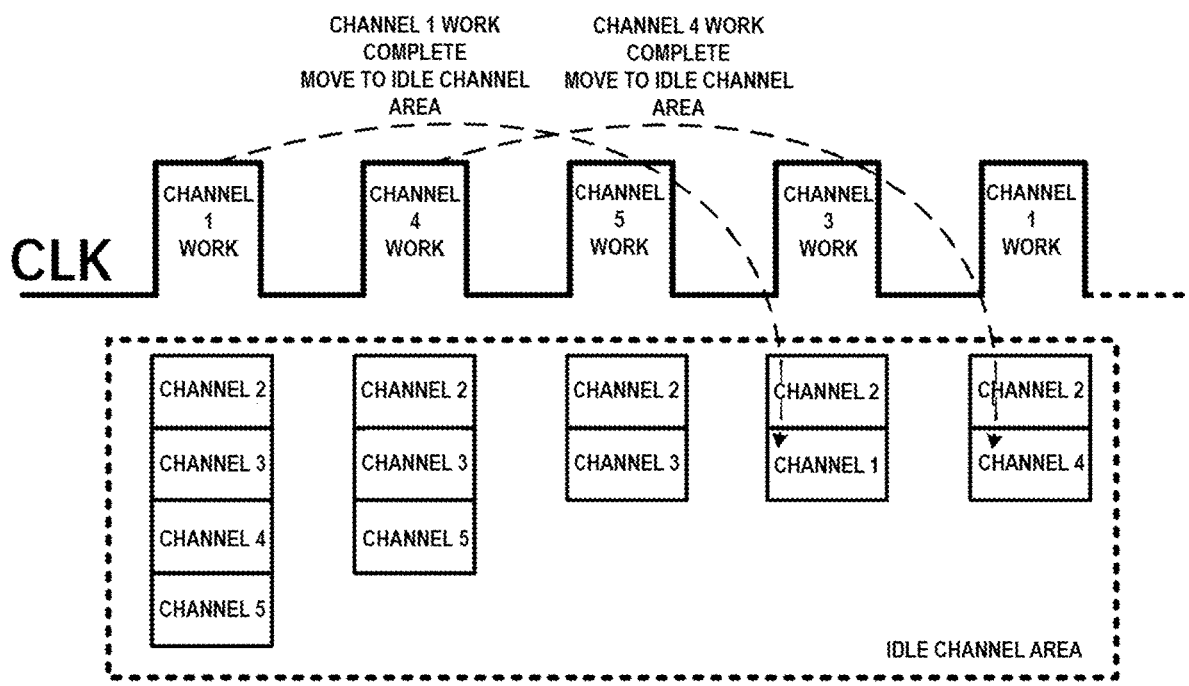
FIG. 2 is a schematic diagram of channel randomization including redundant channels in exemplary embodiments of the present disclosure.
Figure 3A:
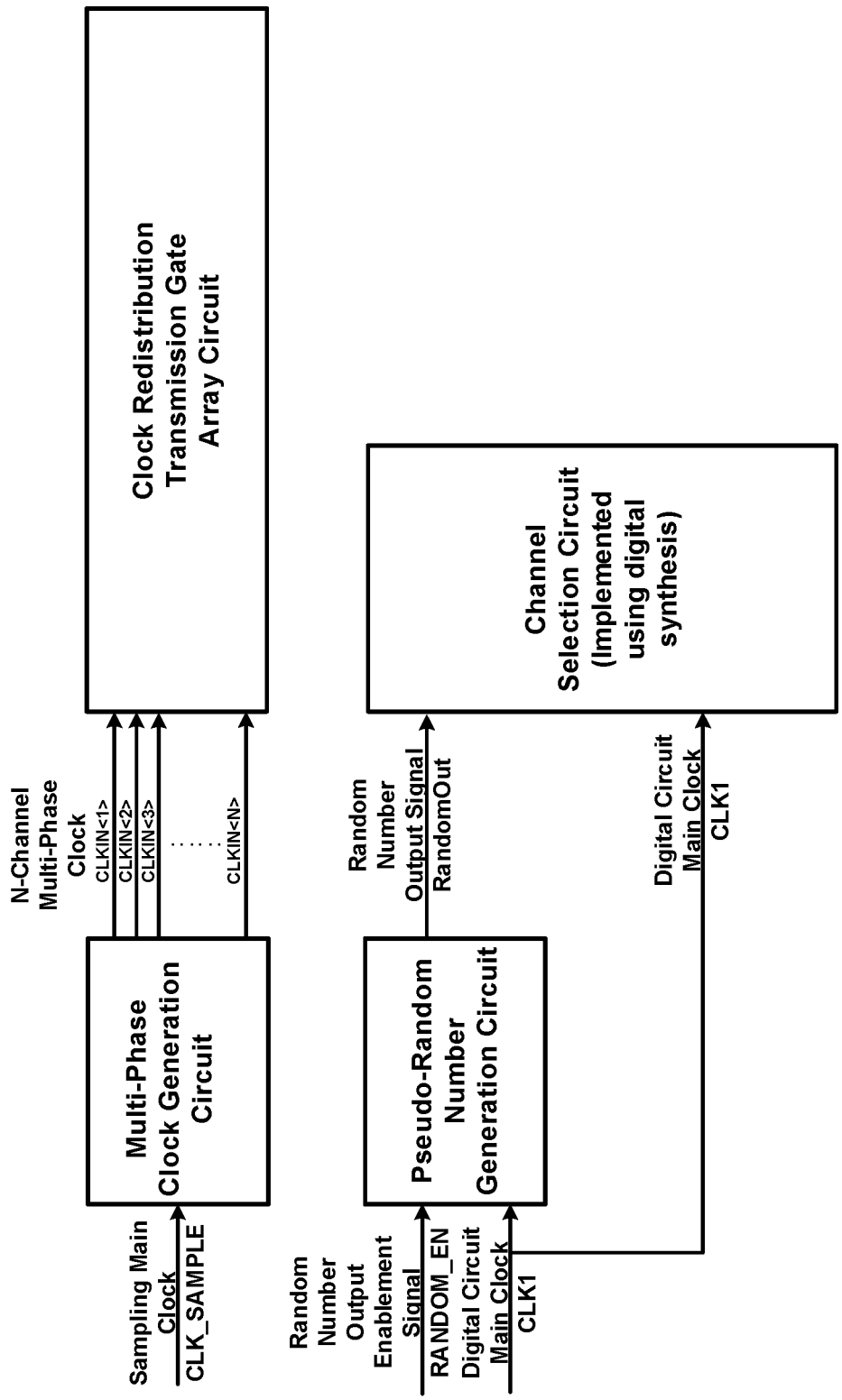
FIG. 3A to FIG. 3D are parts of a schematic circuit diagram of a circuit for channel randomization based on a time-interleaved ADC in exemplary embodiments of the present disclosure.
Figure 3B:
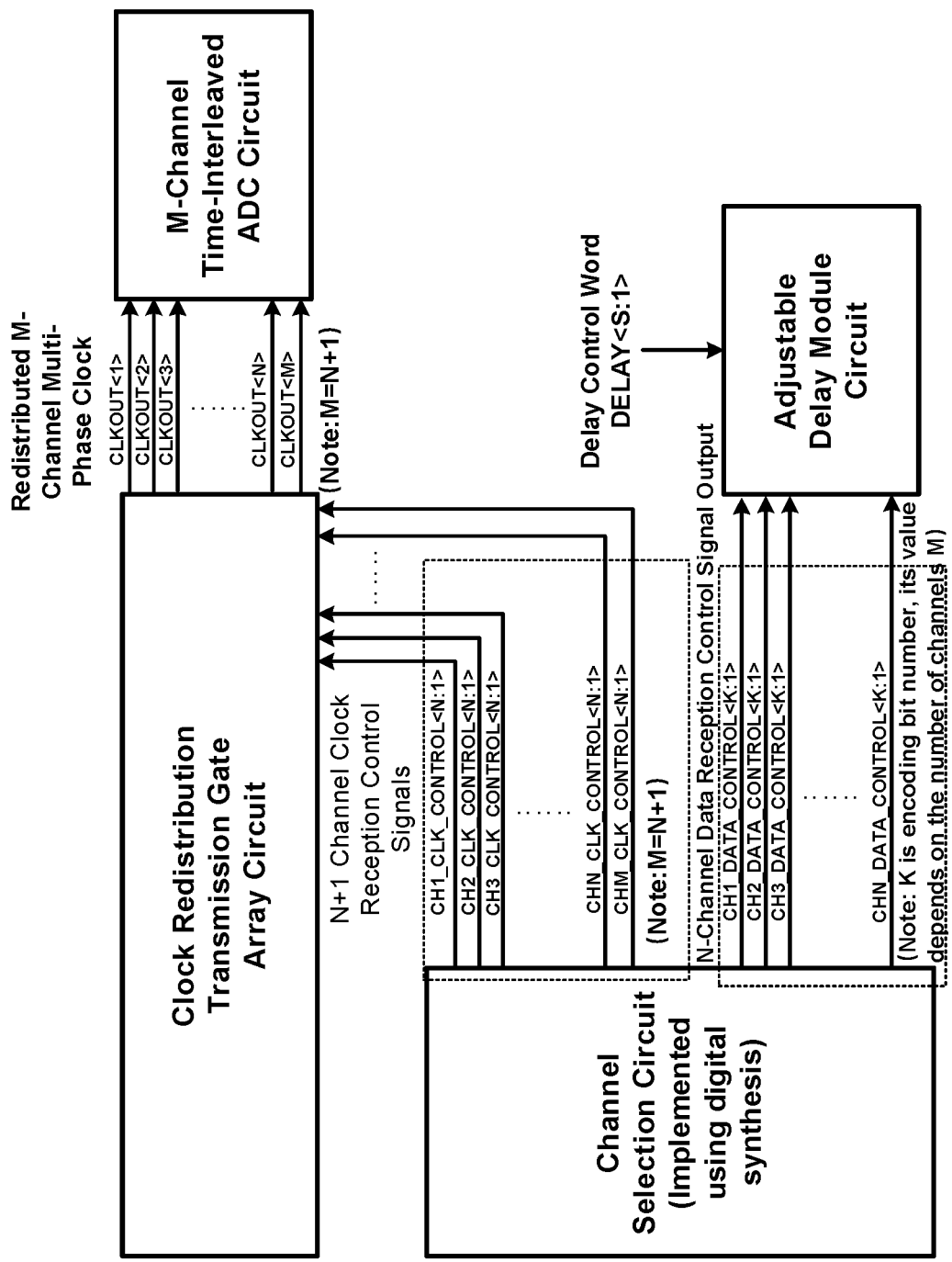
Figure 3C:
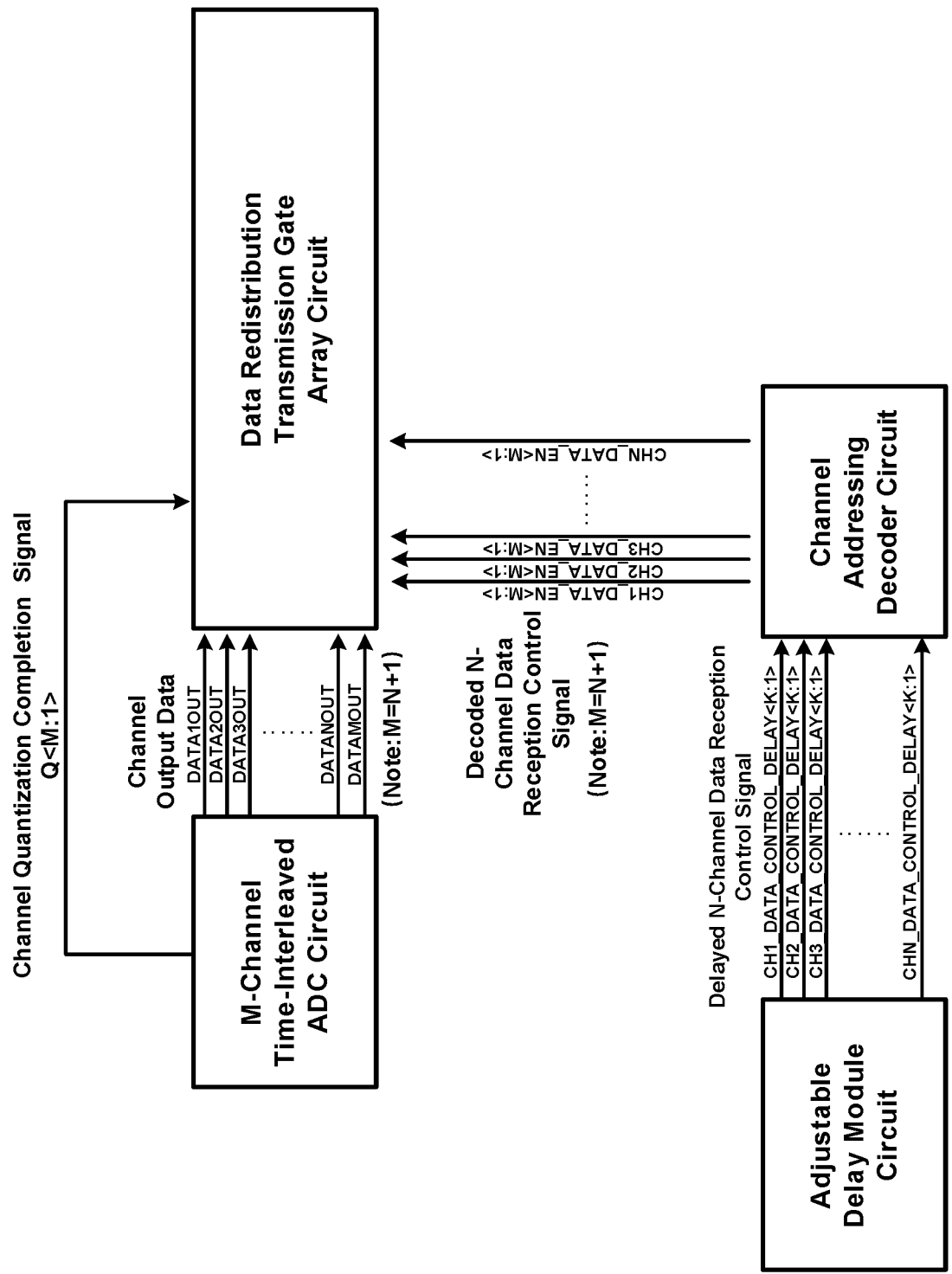
Figure 3D:
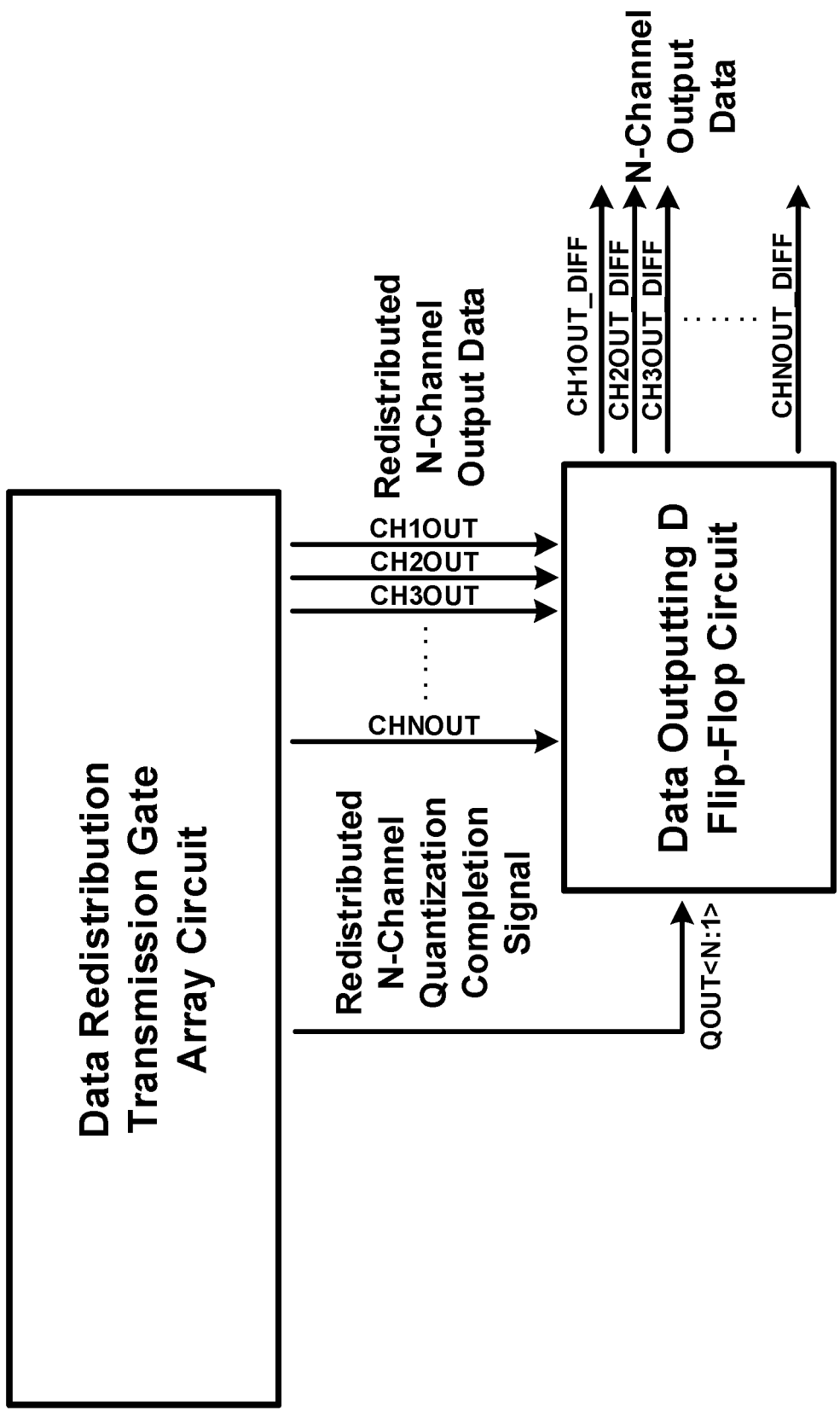

In order to solve the impact of mismatch on the performance of time-interleaved ADCs, academia and industry have proposed many correction algorithms to correct the mismatch between channels. However, the correction effect may not often be ideal and it may be impossible to eliminate all mismatches. On this basis, in order to further improve the performance of time-interleaved ADCs, it is necessary to use channel randomization, which flattens the spurs caused by mismatch between channels to noise floor by disrupting the working sequence of each channel ADC, so as to improve the spurious-free dynamic range (SFDR) of the time-interleaved ADC without affecting the effective number of bits (ENOB) of the time-interleaved ADC itself. A concept diagram of the channel randomization is shown in FIG. 1. A four-channel time-interleaved ADC typically works in the following sequence, i.e., Channel 1, Channel 2, Channel 3, Channel 4, and the cycle repeats, but after channel randomization, the original working sequence of 1, 2, 3, 4 is disrupted and becomes a random order of 1, 4, 1, 3, 2 . . . . In the case where the total number of channels remains unchanged, when the working sequence is disrupted, it is possible that a certain channel has to undergo the next quantization before it has completed the last quantization. Taking the four-channel time-interleaved ADC as an example, the conventional design idea is that the quantization time of a single channel is 4 times the quantization time of the entire time-interleaved ADC. A regular channel working sequence can ensure that after channel 1 starts quantization, at least four quantization cycles (the time it takes for channels 1, 2, 3, and 4 to complete quantization in sequence) are required before channel 1 starts to quantize the next input signal again. Once the working sequence of the channels is randomly disrupted, channel 1 may be used again in less than four cycles. In order to avoid this problem and ensure that the quantization time of each single-channel ADC is sufficient when the working sequence of each single channel is disrupted, a randomization implementation circuit usually adds an additional channel to ensure that the quantization time of each channel is sufficient. The specific principle is shown in FIG. 2. A channel that is more than 4 clock cycles from the last quantization is marked as an idle channel and placed in an idle channel area to distinguish between channels that have been quantized and channels that have not been quantized (i.e., idle channels). Each time a new quantization is started, the channels that are more than 4 cycles from the last quantization are first marked as idle channels and placed in the idle channel area, and then an idle channel is randomly selected from the idle channel area to start this quantization. It is ensured that at least two channels can be randomly selected in each quantization to achieve a randomization effect.

In order to realize the above channel randomization function, the present disclosure provides a circuit for channel randomization based on time-interleaved ADC. The circuit includes the following modules: a channel selection module configured to output M clock reception control signals and N encoded data reception control signals based on a main clock and a generated random number; where M and N are positive integers, and M is greater than N; a multi-phase clock distribution module configured to generate N multi-phase clocks according to a sampling main clock, redistribute multi-phase clocks according to the clock reception control signals, and output M redistributed clock signals; a time-interleaved ADC module configured to output M output data and a corresponding number of channel quantization completion signals according to the redistributed clock signals; an adjustable delay module configured to set a delay length for the data reception control signals; and a timing distribution control module connected to an output end of the adjustable delay module and an output end of the time-interleaved ADC module and is configured to controlling the output data according to the delayed data reception control signals and the channel quantization completion signals such that output data are arranged and output sequentially in a chronological order.

Please refer to FIG. 3A to FIG. 3D. In exemplary embodiments, the channel selection module includes a pseudo-random number generation circuit and a channel selection circuit. The multi-phase clock distribution module includes a multi-phase clock generation circuit and a clock redistribution transmission gate array circuit. The time-interleaved ADC module includes an M-channel time-interleaved ADC circuit. The timing distribution control module includes a channel addressing decoder circuit, a data redistribution transmission gate array circuit, and a data outputting D flip-flop circuit.

For ease of explanation, the M value in the following description is the number of channels of the multi-channel interleaved ADC including redundant channels. The number of redundant channels can be configured according to actual application requirements and is not limited here. The following embodiments only take the case where the number of redundant channels is 1 as an example, so the N value is set to the number of total channels minus 1 (that is, M−1).

In exemplary embodiments, the pseudo-random number generation circuit is implemented using a linear feedback shift register (LFSR). Inputs of the pseudo-random number generation circuit include a digital circuit main clock CLK1 and a random number output enable signal RANDOM_EN, and an output of the pseudo-random number generation circuit is a random number output signal RANDOM_OUT. The random number output signal is set to a 1-bit signal. When the main clock of the digital circuit is input normally, if the RANDOM_EN signal is at a high level, RANDOM_OUT normally outputs a pseudo-random number, and If the RANDOM_EN signal is at a low level, RANDOM_OUT only outputs a low level and does not output random numbers. The pseudo-random number generation circuit is implemented using digital synthesis, because the randomness of the required pseudo-random numbers must be as large as possible to meet the requirements of performance optimization. Usually, the taps of the LFSR will be greater than 40, and the data generated by the LFSR are generally multi-bit signals whose bit width is larger than the tap, where the highest bit of the multi-bit signals is used as the output of the pseudo-random number generation circuit. Using Verilog to write digital circuits and implement the LFSR in a comprehensive manner may greatly save chip area and improve design efficiency.

Figure 4:
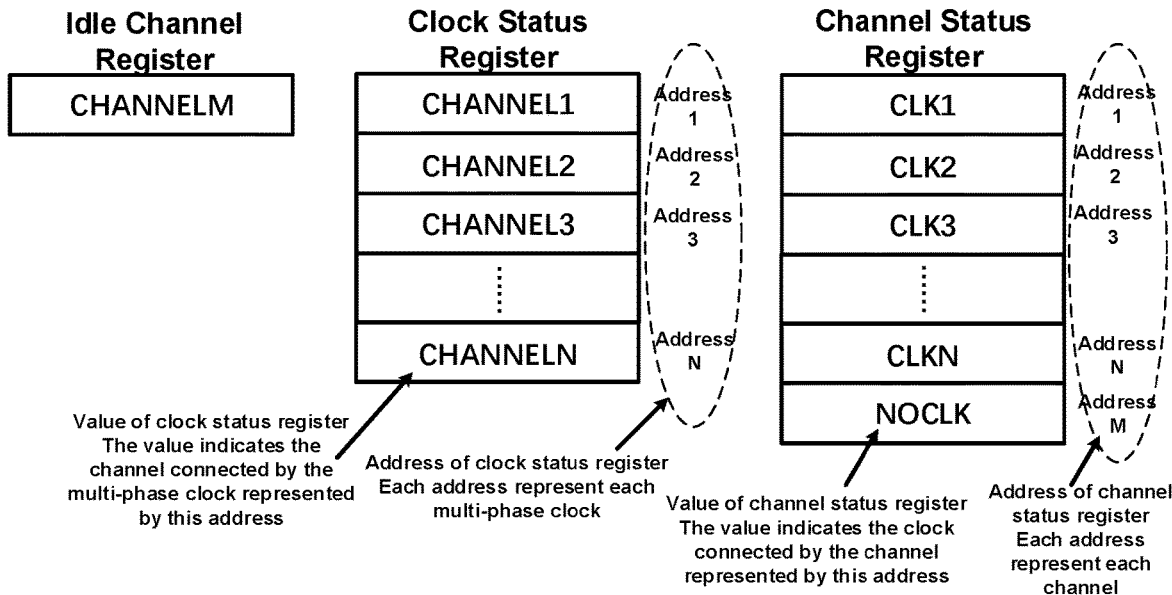
FIG. 4 is a logic function diagram of a channel selection circuit in exemplary embodiments of the present disclosure.

In exemplary embodiments, the channel selection circuit is implemented using digital synthesis, where inputs of the channel selection circuit include random number output signal RandomOut output by the pseudo-random number generation circuit and digital circuit main clock CLK1, and outputs of the channel selection circuit include two parts, where one part includes N+1 (i.e., M) channels of clock reception control signals CH1_CLK_CONTROL<N:1> to CHM_CLK_CONTROL<N:1>, i.e., a total of M N-bit control signals, and the other part includes N channels of data reception control signals CH1_DATA_CONTROL<K:1> to CHN_DATA_CONTROL<K:1>, i.e., a total of N K-bit control signals, in which K is the number of encoding bits, the value of K is determined by the number M of channels, and its purpose is to reduce the number of transmission bits of the control signal. In exemplary embodiments, the encoding is done in a binary form. In exemplary embodiments, the data reception control signals use thermometer code, where each signal has M bits before encoded and K bits after encoded. The logical function of the channel selection circuit is shown in FIG. 4. Usually, the number of redundant channels is 1, so it is assumed that channel 1 to channel N are the number of channels required to interleave the ADC without randomization, and the redundant channel is channel M. the channel selection circuit mainly operates three registers. The first one of the three registers is a clock status register, which has N addresses, and each address represents a multi-phase clock (for example, address 1 represents multi-phase clock 1, and address N represents a multi-phase clock N). Since multi-phase clocks do not require redundancy, there are at most N multi-phase clocks, and the maximum address of the clock status register is N. The value stored in each address of the clock status register represents the channel to which the multi-phase clock represented by this address is connected (for example, CHANNEL1 stored in address 1 represents that multi-phase clock 1 is connected to channel 1, and CHANNELN stored in address N represents that the multiphase clock N is connected to channel N). The second one of the three registers is a channel status register, which has M addresses, and each address represents each channel (for example, address 1 represents channel 1, address N represents channel N, and address M represents channel M). Since there is 1 redundant channel, the number of addresses of the channel status register (which is M) is 1 more than the number of addresses of the clock status register (which is N). The value stored in each address represents the multi-phase clock to which the channel represented by this address is connected (for example, CLK1 stored in address 1 represents that multi-phase clock 1 is connected to channel 1, and CLKN stored in address N represents that multi-phase clock N is connected to channel N). Due to the existence of redundant channels, the number of the addresses of the channel status register will be one more than the number of the multi-phase clocks, which will lead to the inevitable existence of a channel that is not connected by a multi-phase clock. The channel that is not connected by a multi-phase clock is represented by NOCLK (for example, NOCLK stored in address M represents that channel M is not connected by a multi-phase clock and is in a redundant state). In the actual circuit, NOCLK is at a constant low level. The third one of the three registers is an idle channel register, which stores a channel that is not connected by a multi-phase clock (for example, CHANNELM in the idle channel register represents that channel M is not connected by a multi-phase clock and is in an idle state).

Figure 5:
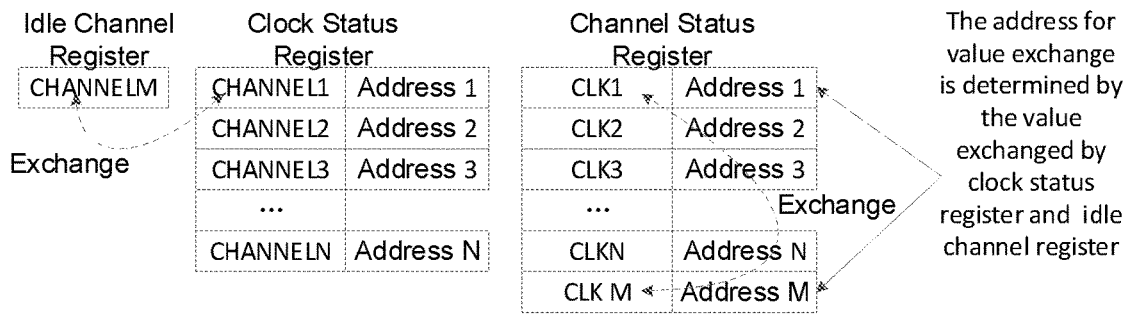
FIG. 5 is a schematic diagram of a process of operations on a clock status register and a channel status register by a channel selection circuit in exemplary embodiments of the present disclosure.

In the initial state, the clock status register stores CHANNEL1 to CHANNELN in address 1 to address N in a sequential order, the channel status register stores CLK1 to CLKN in address 1 to address N in a sequential order and stores NOCLK in address M, and the idle channel register stores CHANNELM. This indicates that when the system is powered on and starts working, each multi-phase clock corresponds to a channel in sequence, and a redundant channel without a corresponding multi-phase clock becomes an idle channel. When the main clock of the digital circuit comes for the first time, the channel selection circuit operates on address 1 of the clock status register. For example, the channel selection circuit controls the value stored in address 1 based on an externally input random number (i.e., the random number output signal RandomOUT). If the externally input random number is at a high level, then the channel selection circuit exchanges the value stored in address 1 with the value stored in the idle channel register. At the same time, the channel status register determines which two addresses in the channel status register need to be exchanged based on the value in address 1 of the clock status register and the value in the idle channel register that have been exchanged (for example, if CHANNEL1 in address 1 of the clock status register and CHANNELM in the idle channel register is exchanged, then the value in address 1 of the channel status register and the value in address M of the channel status register need to be exchanged). The process is shown in FIG. 5. After the exchange is completed, wait for the next main clock to come. If RandomOut is at a low level, no operation will be performed on the clock status register, and the channel status register also remains unchanged until the next main clock of the digital circuit comes. When the main clock of the digital circuit comes for the second time, the channel selection circuit performs an exchange operation on address 2 of the clock status register. After the operation on address N is completed, when the main clock comes again, an operation will be performed on address 1 again, and this cycle repeats endlessly. While the three registers are constantly changing, the channel selection circuit outputs corresponding signals based on the values stored in the clock status register and in the channel status register. According to the channel status register, the channel selection circuit will output M N-bit thermometer code signals CH1_CLK_CONTROL<N:1> to CHM_CLK_CONTROL<N:1>. The values of these M signals correspond to the values stored in address 1 to address M of the channel status register, respectively. If the value of the channel status register is CLK1, then the signal is the N-bit thermometer code 00000 . . . 01. If the value of the channel status register is CLK2, then the signal is the N-bit thermometer code 00000 . . . 10, and so on. If the value of the channel status register is CLKN, then the signal is N-bit thermometer code 10000 . . . 00. If the value of the channel status register is NOCLK, then the signal is N-bit all-zero, i.e., 00000 . . . 00. According to the clock status register, the channel selection circuit will output N K-bit binary-coded signals CH1_DATA_CONTROL<K:1> to CH1N_DATA_CONTROL<K:1>. The value of K is determined by the number M of channels. K and M satisfy the binary relationship, that is, two to the power of K must be greater than or equal to M (for example, M is 8, K is at least 3; M is 17, K is at least 5, and so on). These N K-bit binary code signals correspond to the values in address 1 to address N of the clock status register, respectively. If the value of the clock status register is CHANNEL1, then the signal is 00 . . . 01. If the value of the clock status register is CHANNEL2, then the signal is 00 . . . 10. The corresponding relationship between the values of the clock status register and the signals is shown in FIG. 6.

Figures 6, 7:
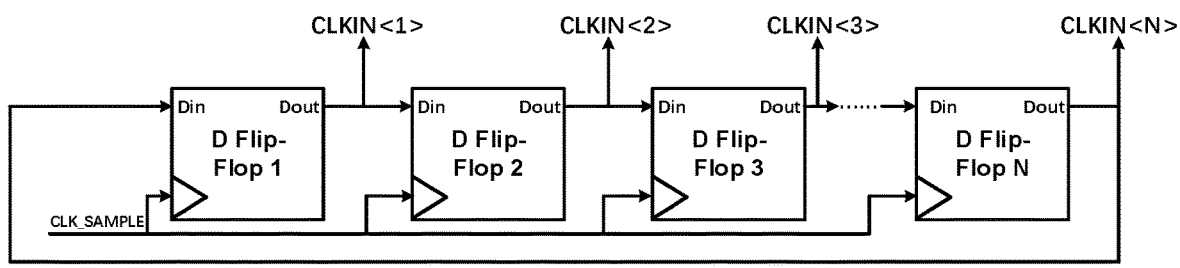
FIG. 6 is a schematic diagram of a corresponding relationship between an output signal of a channel selection circuit and a value stored in a clock status register in exemplary embodiments of the present disclosure.
FIG. 7 is a schematic diagram of a multi-phase clock generation circuit in exemplary embodiments of the present disclosure.

Referring to FIG. 7, in exemplary embodiments, the multi-phase clock generation circuit includes N cascaded D flip-flops, and an output of the last D flip-flop is fed to an input of the first D flip-flop to form a loop. The multi-phase clock generation circuit is configured to provide N multi-phase clocks for the time-interleaved ADC circuit. An input signal of the multi-phase clock generation circuit is a sampling main clock CLK_SAMPLE. The frequency of this main clock is often consistent with the sampling frequency of the interleaved ADC. Output signals of the multi-phase clock generation circuit are N multi-phase clock signals CLKIN<1> to CLKIN<N>. CLK_SAMPLE signal is input to clock input ends of all D flip-flops. A signal output by a data output end Dout of the first D flip-flop is input to a data input end Din of the next D flip-flop, and an output signal of the data output end Dout of the first D flip-flop is also used as the output CLKIN<1> of the multi-phase clock generation circuit. Similarly, the signal output by the output end Dout of the second D flip-flop is input to the data input end Din of the third D flip-flop, and the output signal of the second D flip-flop data output end Dout is also used as the output CLKIN<2> of the multi-phase clock circuit generation circuit, and so on, until the last D flip-flop. That is to say, the input signal of the last D flip-flop is the signal output by the output end of the previous D flip-flop, and the signal output by the output end Dout of the last D flip-flop is input to the input end of the first D flip-flop. In addition, the signal output by the output end of the last D flip-flop is used as the output CLKIN<N> of the multi-phase clock generation circuit.

Figure 8A:
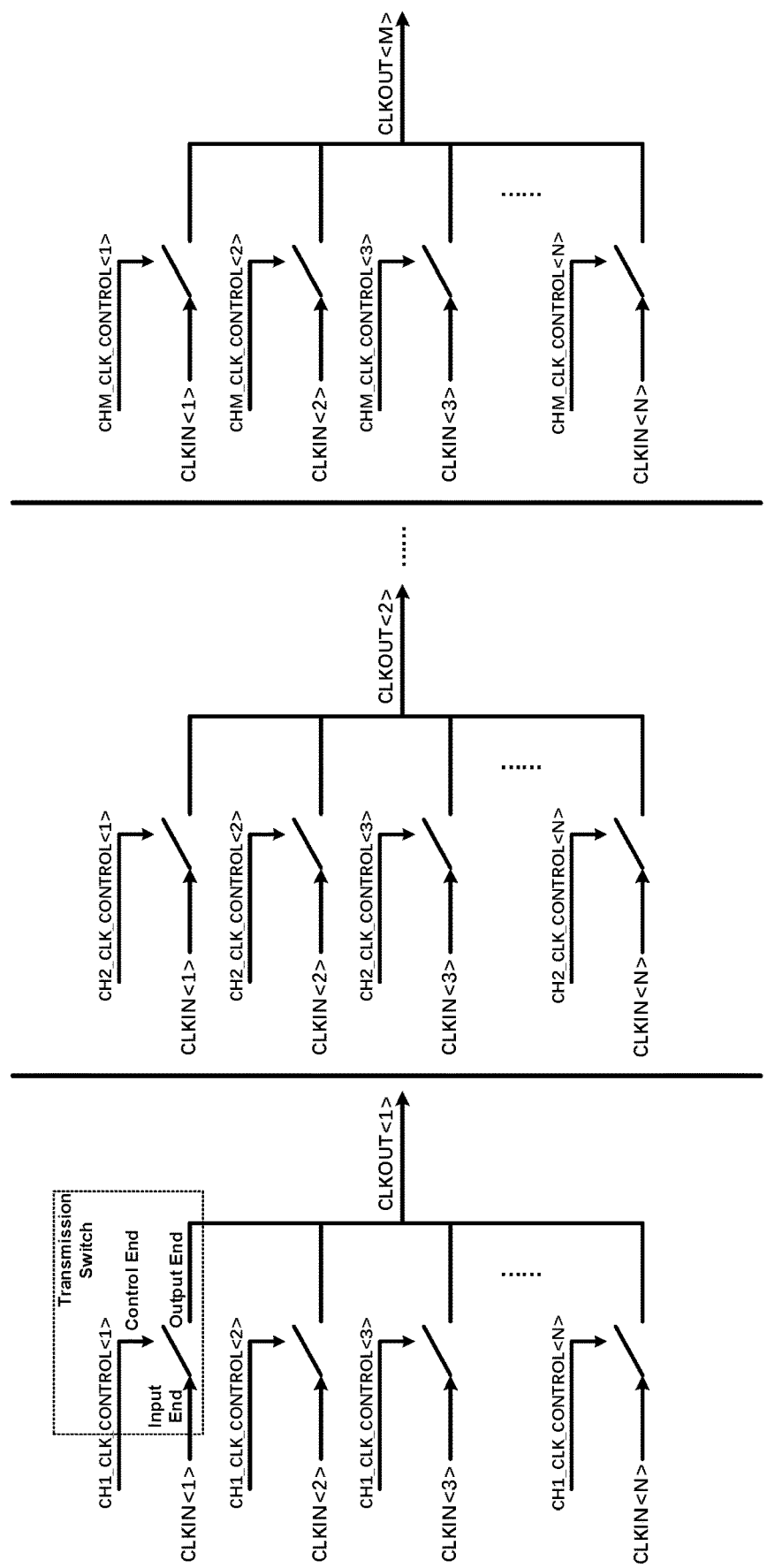
FIG. 8A to FIG. 8B show a circuit structure of a clock redistribution transmission gate array in exemplary embodiments of the present disclosure.
Figure 8B:
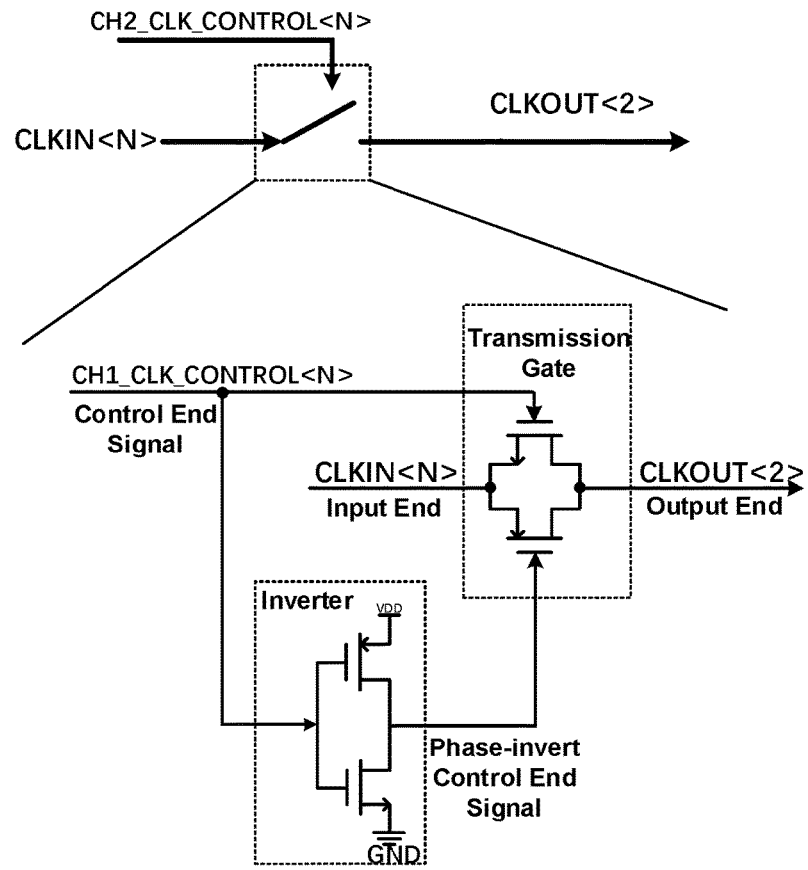

In exemplary embodiments, the clock redistribution transmission gate array circuit includes a transmission switch array, where inputs of the clock redistribution transmission gate array circuit include N channels of multi-phase clock signals CLKIN<1> to CLKIN<N> generated by the multi-phase clock generation circuit and N+1 (i.e. M) channels of clock reception control signals CH1_CLK_CONTROL<N:1> to CHM_CL K_CONTROL<N:1> output by the channel selection circuit, and outputs of the clock redistribution transmission gate array circuit include M channels of redistributed multi-phase clock signals CLKOUT<1> to CLKOUT<M>. The clock redistribution transmission gate array circuit is configured to distribute N channels of input multi-phase clock signals to various time-interleaved ADC circuits based on M channels of input clock reception control signals. The circuit structure of the clock redistribution transmission gate array circuit is shown in FIGS. 8A and 8B. The clock redistribution transmission gate array circuit includes multiple transmission switches. The transmission switch includes an input end or terminal, a control end or terminal, and an output end or terminal. The clock redistribution transmission gate array circuit has M output signals each formed by connecting outputs of N transmission switches together in parallel. Input ends of these N transmission switches are multi-phase clock signals CLKIN<1> to CLKIN<N>, respectively, and control ends of these N transmission switches vary according to the output signals. For example, if the output signal is CLKOUT<1>, then the control ends are sequentially CH1_CLK_CONTROL<1> to CH1_CLK_CONTROL<N>, if the output signal is CLKOUT<2>, then the control ends are sequentially CH2_CLK_CONTROL<1> to CH2_CLK_CONTROL<N>, and so on. Similarly, if the output signal is CLKOUT<M>, then the control ends are sequentially CHM_CLK_CONTROL<1> to CHM_CLK_CONTROL<N>, and a total of N*M transmission switches are required. The transmission switch includes a transmission gate and an inverter. The transmission gate includes a PMOSFET (p-type metal-oxide-semiconductor field-effect transistor) and an NMOSFET (n-type metal-oxide-semiconductor field-effect transistor), where the source of the PMOSFET is connected to the source of the NMOSFET, the drain of the PMOSFET is connected to the drain of the NMOSFET. The sources of the NMOSFET and the PMOSFET are short-circuited as an input end of the transmission gate, and the drains of the NMOSFET and the PMOSFET are short-circuited as an output end of the transmission gate. The control signal is directly connected to the gate of the NMOSFET of the transmission gate and also to an input end of the inverter. An output of the inverter is connected to the gate of the PMOSFET of the transmission gate.

In exemplary embodiments, the M-channel time-interleaved ADC circuit is a time-interleaved ADC containing M channels. It does not have to refer to a specific type of ADC, and it may refer to any time-interleaved ADC that includes M channels and can output data and a quantization completion signal of each channel. Input signals of the M-channel time-interleaved ADC circuit include M channels of redistributed multi-phase clock signals CLKOUT<1> to CLKOUT<M> output by the clock redistribution transmission gate array circuit, and output signals of the M-channel time-interleaved ADC circuit include M channel quantization completion signals Q<M:1> and M channel output data DATA1OUT to DATAMOUT. A channel quantization completion signal indicates whether the channel has completed quantization. When the multi-phase clock input to the channel becomes a high level, the channel quantization completion signal of the channel is at a low level, indicating that the channel is being quantized and has not yet completed quantization. When the channel completes quantization, the channel quantization completion signal turns to a high level, indicating that the channel has completed quantization. The channel output data refers to the output result of each channel ADC. The channel output data are usually multi-bit data, and the number of bits depends on the resolution of the ADC.

Figure 9:
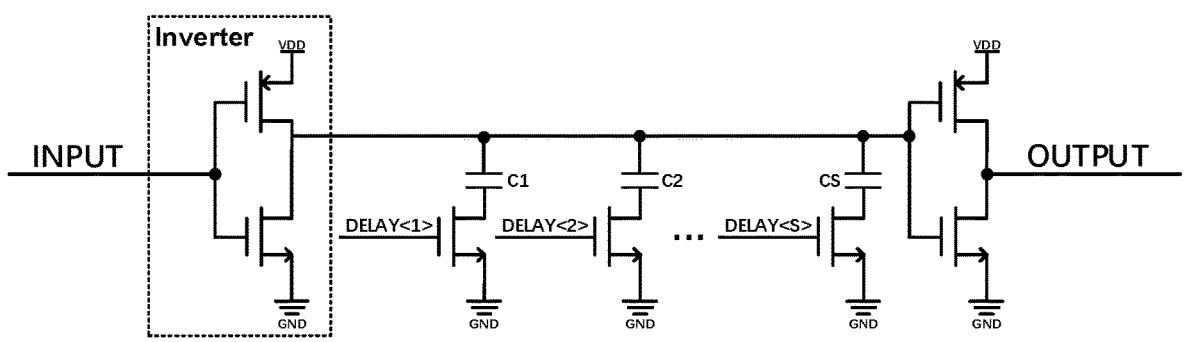
FIG. 9 is a schematic diagram of a circuit structure of a delay unit in exemplary embodiments of the present disclosure.

In exemplary embodiments, the adjustable delay module circuit includes an inverter, an NMOSFET, and a capacitor. Input signals of the adjustable delay module circuit include N channels of data reception control signals CH1_DATA_CONTROL<K:1> to CHN_DATA_CONTROL<K:1> output by the channel selection circuit and a delay control word DELAY<S:1> used to control the delay length, where S represents the number of bits of the delay control word. The more bits, the higher the accuracy of delay control. Output signals of the adjustable delay module circuit include N channels of delayed data reception control signals CH1_DATA_CONTROL_DELAY<K:1> to CHN_DATA_CONTROL_DELAY<K:1>. The adjustable delay module circuit is configured to adjust the delay of the data reception control word, so that the data reception control word does not reach the subsequent circuit too quickly, ensuring that the control signals are received only when the ADC is about to complete quantization, and ensuring that data will not be output untimely due to receiving the control signals too early. The adjustable delay module circuit includes many delay units. Each input signal requires a delay unit. The specific structure of the delay unit is shown in FIG. 9. The delay unit includes two inverters, S delay control NMOSFETs, and S delay capacitors. Single-bit input signal INPUT is connected to an input end of the inverter. S capacitors are connected in parallel to an output end of the inverter. The other end of each capacitor is connected to the drain of a delay control NMOSFET. The gate of the delay control NMOSFET is connected to a corresponding delay control word. The control words control the delay control NMOSFETs of all delay units together. The output end of the inverter is connected to the input end of the next inverter, and the output end of the next inverter is the output end of the delay unit. The size and quantity of the delay capacitors together determine the range and accuracy of the delay. The length of the delay is controlled by controlling the delay control word.

In exemplary embodiments, the channel addressing decoder circuit includes a logic gate. Inputs of the channel addressing decoder circuit include delayed N channels of data reception control signals CH1_DATA_CONTROL_DELAY<K:1> to CHN_DATA_CONTROL_DELAY<K:1>. Outputs of the channel addressing decoder circuit include N channels of decoded data reception control signals CH1_DATA_EN<M:1> to CHN_DATA_EN<M:1>. The channel addressing decoder circuit is configured to decode N channels of binary data reception signals delayed by the adjustable delay module circuit into a thermometer code with M bits. Since the channel selection circuit and the data output end are usually physically far apart from each other, if the N channels of data reception control signals are directly output using the M-bit thermometer code, the layout wiring may be too lengthy and complicated. Therefore, the N channels of data reception signals are output first in the form of a K-bit binary code. After data reception signals pass through the adjustable delay module circuit and reach a position closer to the data output end, the channel addressing decoder circuit is configured to decode the K-bit binary code into an M-bit thermometer code. The specific circuitry of the channel addressing decoder depends on the value of M.

Figure 10:
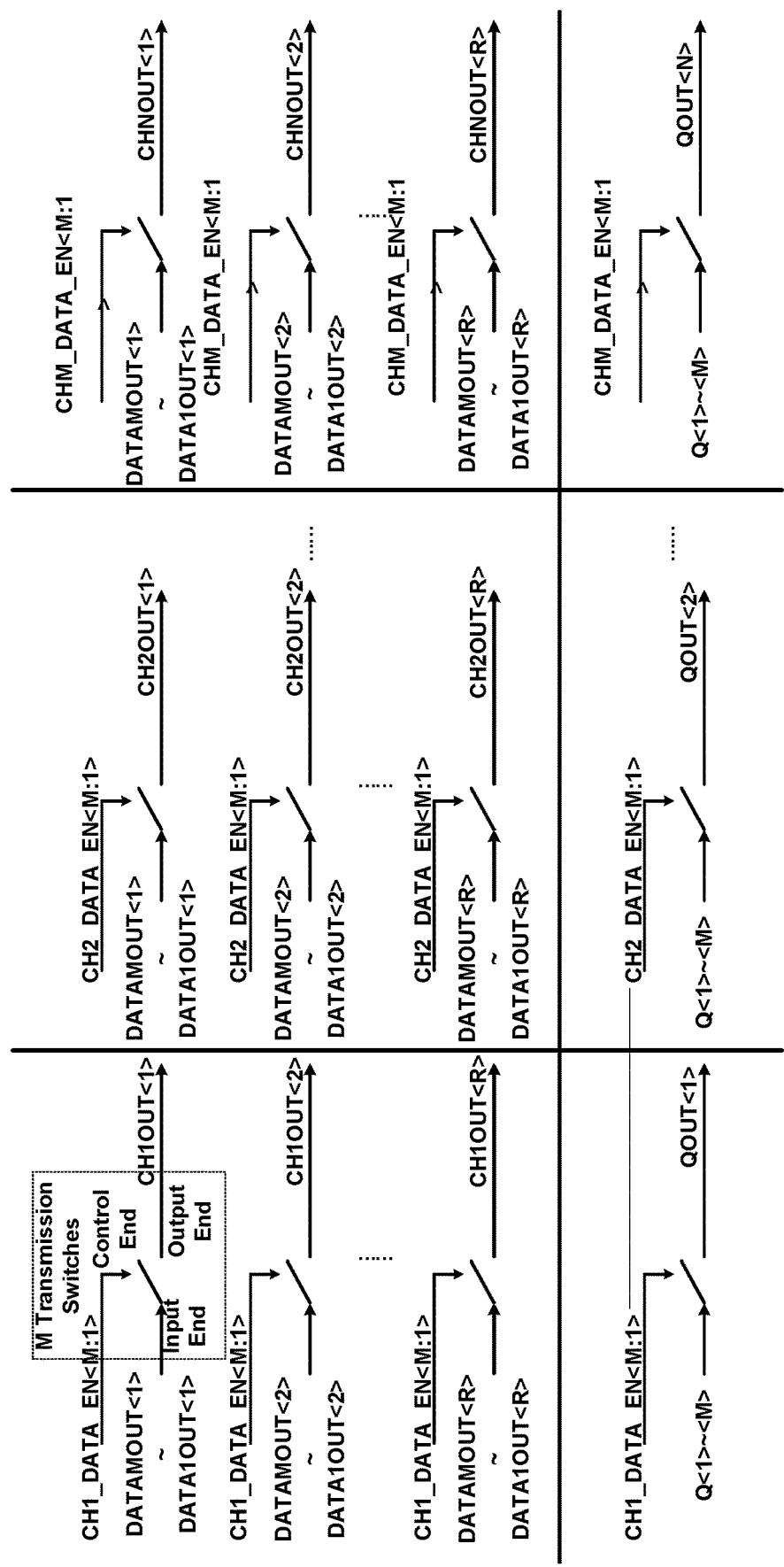
FIG. 10 is a schematic circuit diagram of a data redistribution transmission gate array in exemplary embodiments of the present disclosure.

In exemplary embodiments, the data redistribution transmission gate array circuit mainly includes a transmission switch array, and the structure of the transmission switch is the same as that in the clock redistribution transmission gate array circuit. Inputs of the data redistribution transmission gate array circuit include three parts. The first part includes the channel quantization completion signals Q<M:1> output by the M-channel time-interleaved ADC circuit, which are M single-bit signals. The second part includes the channel output data DATA1OUT to DATAMOUT output by the M-channel time-interleaved ADC circuit, which are M multi-bit signals, and the number of bits of each signal depends on the resolution of the time-interleaved ADC. The third part includes decoded N channels of data reception control signals CH1_DATA_EN<M:1> to CHN_DATA_EN<M:1> output by the channel addressing decoder circuit. Outputs of the data redistribution transmission gate array circuit include two parts. The first part includes redistributed N channels of output data, which are N multi-bit signals, and the number of bits of each signal depends on the resolution of the time-interleaved ADC. The second part includes redistributed N channels of quantization completion signals QOUT<N:1>, which are N single-bit signals. The data redistribution transmission gate array circuit is configured to redistribute M channels of input channel output data and channel quantization completion signals to N channels. This is because the working sequence of the channels is disrupted, and the output data of each channel are not arranged sequentially in chronological order. Therefore, the disrupted signals need to be redistributed in a working order, so that the final output data are arranged sequentially in a chronological order. The circuit diagram of the data redistribution transmission gate array circuit is shown in FIG. 10. For ease of explanation, it is assumed that the resolution (number of bits) of the time-interleaved ADC is R bits, so the input DATA1OUT to DATAMOUT are represented as DATA1OUT<R:1> to DATAMOUT<R:1>, and the output N channels of redistributed output data are represented as CH1OUT<R:1> to CHNOUT<R:1>. The first part of the input signals DATA1OUT<R:1> to DATAMOUT<R:1> are all connected to input ends of the transmission switches. The input N channels of decoded data reception control signals are connected to control ends of different transmission switches depending on different input signals, where each control signal will be connected to the control ends of R transmission switches. For example, the control signal CH1_DATA_EN<1> is connected to the control end of the transmission switch that takes DATA1OUT<1> to DATA1OUT<R> as the input signals, and the control signal CH1_DATA_EN<2> is connected to the control end of the transmission switch that takes DATA2OUT<1> to DATA2OUT<R> as the input signals . . . , and the control signal CH1_DATA_EN<M> is connected to the control end of the transmission switch that takes DATAMOUT<1> to DATAMOUT<R> as the input signals. The subsequent control signals are following the same rule as above. For example, the control signals CH2_DATA_EN<1> to the control signal CHM_DATA_EN<1> are respectively connected to the control ends of the transmission switches that take DATA1OUT<1> to DATA1OUT<R> as the input signals . . . , and the control signals CH2_DATA_EN<M> to the control signal CHM_DATA_EN<M> are respectively connected to the control ends of the transmission switches that take DATAMOUT<1> to DATAMOUT<R> as the input signals, and so on. The second part of the input signal QOUT<M:1> is similar to the first part of the input signal. The second part of the input signal is also connected to the input end of the transmission switch, and the input N channels of decoded data reception control signals are also connected to the control ends of different transmission switches according to different input signals. The difference between the first part and the second part is that, for the second part, each control signal only needs to be connected to the control end of one transmission switch. For example, the control signal CH1_DATA_EN<1> is connected to the control end taking Q<1> as the input signal, and the control signal CH1_DATA_EN<2> is connected to the control end of the transmission switch taking Q<2> as the input signal . . . , and the control signal CH1_DATA_EN<M> is connected to the control end of the transmission switch taking Q<M> as the input signal. The subsequent control signals are following the same rule as above. For example, the control signals CH2_DATA_EN<M:1> to CHM_DATA_EN<M:1> are respectively connected to the control ends of the transmission switches taking Q<M> to Q<1> as the input signals, so a total of M*(R+1)*N transmission switches are needed. The first part of the output signals CH1OUT<R:1> to CHNOUT<R:1> are connected to the output ends of corresponding transmission switches according to the input signals and the control signals of the transmission switches, and each output signal will be connected to the output ends of M transmission switches. For example, the output signals CH1OUT<1> to CH1OUT<R> are respectively correspondingly connected to the output ends of the transmission switches taking DATAMOUT<1> to DATA1OUT<1>, DATAMOUT<2> to DATA1OUT<2> . . . , and DATAMOUT<R> to DATA1OUT<R> as the input ends and taking CH1_DATA_EN<M:1> as the control ends. For example, the output signals CH2OUT<1> to CH2OUT<R> are respectively correspondingly connected to the output ends of the transmission switches taking DATAMOUT<1> to DATA1OUT<1>, DATAMOUT<2> to DATA1OUT<2> . . . , and DATAMOUT<R> to DATA1OUT<R> as the input ends and taking CH2_DATA_EN<M:1> as the control ends. Similarly, CHNOUT<1> to CHNOUT<R> are correspondingly connected to the output ends of the transmission switches taking DATAMOUT<1> to DATA1OUT<1>, DATAMOUT<2> to DATA1OUT<2> . . . , and DATAMOUT<R> to DATA1OUT<R> as the input ends and taking CH2_DATA_EN<M:1> as the control ends. Similarly, another part of the output signals QOUT<N:1> are connected respectively to the output ends of corresponding transmission switches according to the input signals of the transmission switches and the decoded data reception control signals, and each output signal will be connected to the output ends of M transmission switches. For example, QOUT<1> is connected to the output end of the control switch taking Q<M> to Q<1> as its input end and taking CH1_DATA_EN<M> to CH1_DATA_EN<1> as its control end. For example, QOUT<2> is connected to the output end of the control switch taking Q<M> to Q<1> as its input end and taking CH2_DATA_EN<M> to CH2_DATA_EN<1> as its control end. Similarly, QOUT<N> is connected to the output end of the control switch taking Q<M> to Q<1> as its input end and taking CH M_DATA_EN<M> to CHM_DATA_EN<1> as its control end.

Figure 11:
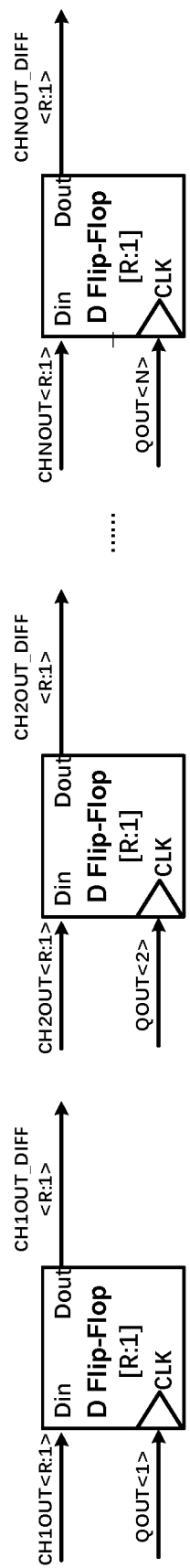
FIG. 11 is a schematic circuit diagram of a data outputting D flip-flop in exemplary embodiments of the present disclosure.

In exemplary embodiments, the data outputting D flip-flop circuit mainly includes a D flip-flop array. Input signals of the data outputting D flip-flop circuit include the redistributed N channels of quantization completion signals QOU<N:1> output by the data redistribution transmission gate array circuit and the redistributed N channels of output data CH1OUT to CHNOUT, where QOUT<N:1> are N single-bit signals, CH1OUT to CHNOUT are multi-bit signals, and the number of bits depends on the resolution of the time-interleaved ADC. Output signals of the data outputting D flip-flop circuit are N channels of final output data CH1_OUT_DIFF to CHN_OUT_DIFF. The structure of the data outputting D flip-flop circuit is shown in FIG. 11. It is assumed that the resolution of the time-interleaved ADC is R (that is, the number of bits of the N channels of output data after redistribution is R). The input signals CH1OUT<R:1> to CHNOUT<R:1> are correspondingly connected to data input ends (i.e., Din terminal) of R D flip-flops, respectively, and the quantization completion signals are correspondingly connected to CLK ends (i.e., CLK terminal) of the D flip-flop taking CH1OUT<R:1> to CHNOUT<R:1> as input signals of the data input ends. For example, QOUT<1> is connected to the CLK end of the D flip-flop taking CH1OUT<R:1> as the data input end, and QOUT<2> is connected to the CLK end of the D flip-flop taking CH2OUT<R:1> as the data input end. Similarly, QOUT<N> is connected to the CLK end of the D flip-flop taking CHNOUT<R:1> as the data input end. Therefore, a total of R*N D flip-flops are required. The output signals CH1OUT_DIFF<R:1> to CHNOUT_DIFF<R:1> are correspondingly respectively connected to data output ends (i.e., Dout terminal) of the D flip-flops taking CH1OUT<R:1> to CHNOUT<R:1> as input signals for the data input ends. For example, CH1OUT_DIFF<R:1> are respectively correspondingly connected to the Dout terminal of the D flip-flop taking CH1OUT<R:1> as the data input end, and CH2OUT_DIFF<R:1> are respectively correspondingly connected to the Dout terminal of the D flip-flop taking CH2OUT<R:1> as the data input end. Similarly, CHNOUT_DIFF<R:1> are respectively correspondingly connected to the Dout terminal of the D flip-flop taking CHNOUT<R:1> as the data input end.

In exemplary embodiments, the digital circuit main clock is usually consistent with the sampling main clock (that is, they have the same frequency). When the frequency of the sampling main clock is extremely high (above 1 GHZ), since the digitally synthesized circuit cannot support such a high frequency, the frequency of the digital circuit main clock may be reduced. The reduced frequency needs to meet the following conditions. The first condition is that the reduced frequency is one X-th of the sampling main clock, where X is a frequency-division factor and is an integer. For example, the frequency of the digital circuit main clock is reduced to half, one-third, one-fourth, or the like, of the sampling frequency. The second condition is that the number X and the number of remaining channels after the redundant channels are removed are coprime. For example, for a time-interleaved ADC whose number of remaining channels is 8 after the redundant channels are removed, the reduced frequency of the digital circuit main clock is one-third or one-fifth of the sampling frequency, but not half or one-fourth of the sampling frequency, because two or four are not coprime with eight. On the basis of meeting these two conditions, the frequency of the digital circuit main clock may be reduced.

In exemplary embodiments, in order to further verify the performance of the circuit for channel randomization based on time-interleaved ADC of the present disclosure, under a 28 nm CMOS process, the above-mentioned circuit for channel randomization based on time-interleaved ADC is applied to a time-interleaved SAR ADC in which the sampling main clock is 4 GHZ, the resolution is 12 bits (where the ADC has 3 redundant bits, and the actual output data have 15 bits), Vpp is 0.8V, and the total number of channels is 17 (16 interleaved channels and 1 redundant channel for randomization).

According to the above parameters, it is determined that the sampling main clock is 4 GHz, the number of multi-phase clocks output by the multi-phase clock generation circuit is 16, the frequency of a single-channel multi-phase clock after frequency division is 250 MHz, and the digital circuit main clock is 800 MHZ. LFSR in the pseudo-random number generation circuit has 42 bits, and taps of the LFSR are [41,20,1]. The channel selector outputs 17 channel clock reception control signals each having 16 bits and 16 channel data reception control signals each having 5 bits. The number of the delay control words is 5. The control word and the capacitance of the capacitor are adjusted to ensure that the delay is at least 1.25 ns. The number of bits of the channel quantization completion signal is 17, the channel output data are 17 data each having 15 bits. The number of channel quantization completed signals after redistribution is 16, and the channel output data after redistribution is 16 data each having 15 bits. The data of the final output signal includes 16 data each having 15 bits. Since there are 17 channels and the channel data reception control signal has 5 bits, the lower 4 bits 1111 to 0000 of this 5-bit binary code are used to represent channel 16 to channel 1, and the highest bit of this 5-bit binary code is used to represent channel 17 and non-channel 17. Therefore, in the channel addressing decoder circuit, a 4-16 decoder is used to convert the lower 4 bits into a 16-bit thermometer code. In addition, whether the highest bit is 1 is used to directly determine whether it is channel 17. If it is channel 17, then the 17th bit of the thermometer code is 1, otherwise, it is 0. The combination of the two completes the decoding, converting the 5-bit binary code into a 17-bit thermometer code.

Figure 12:
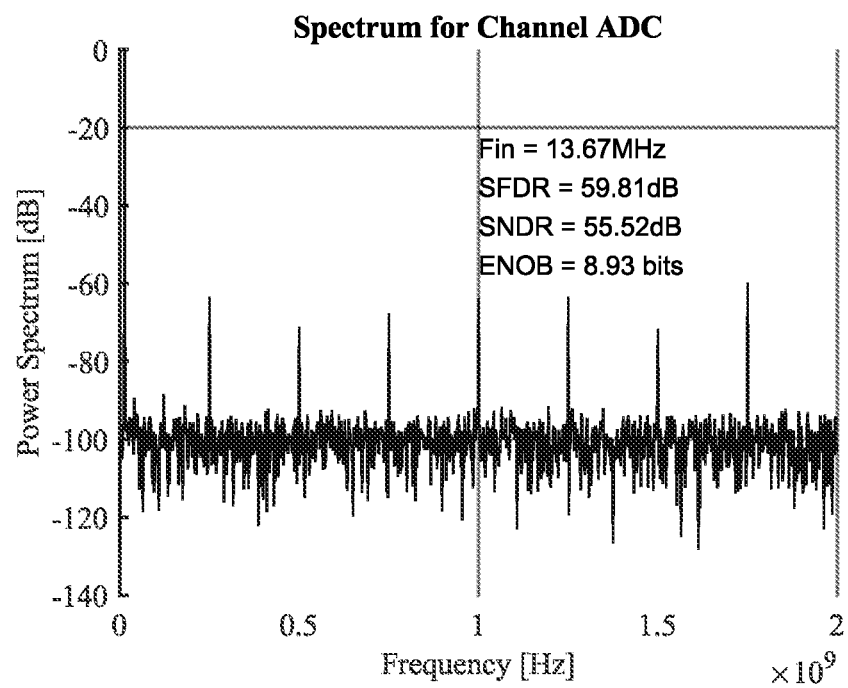
FIG. 12 is a spectrum diagram of a time-interleaved ADC in which mismatch is added but randomization is not performed in exemplary embodiments of the present disclosure.
Figure 13:
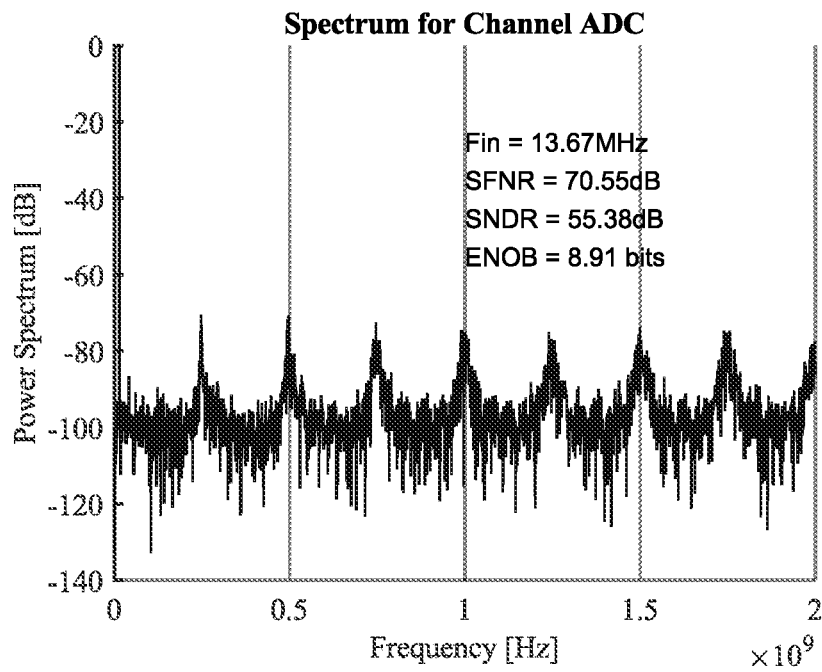
FIG. 13 is a spectrum diagram of a time-interleaved ADC in which adding mismatch is added and randomization is performed in exemplary embodiments of the present disclosure.
Figure 14:
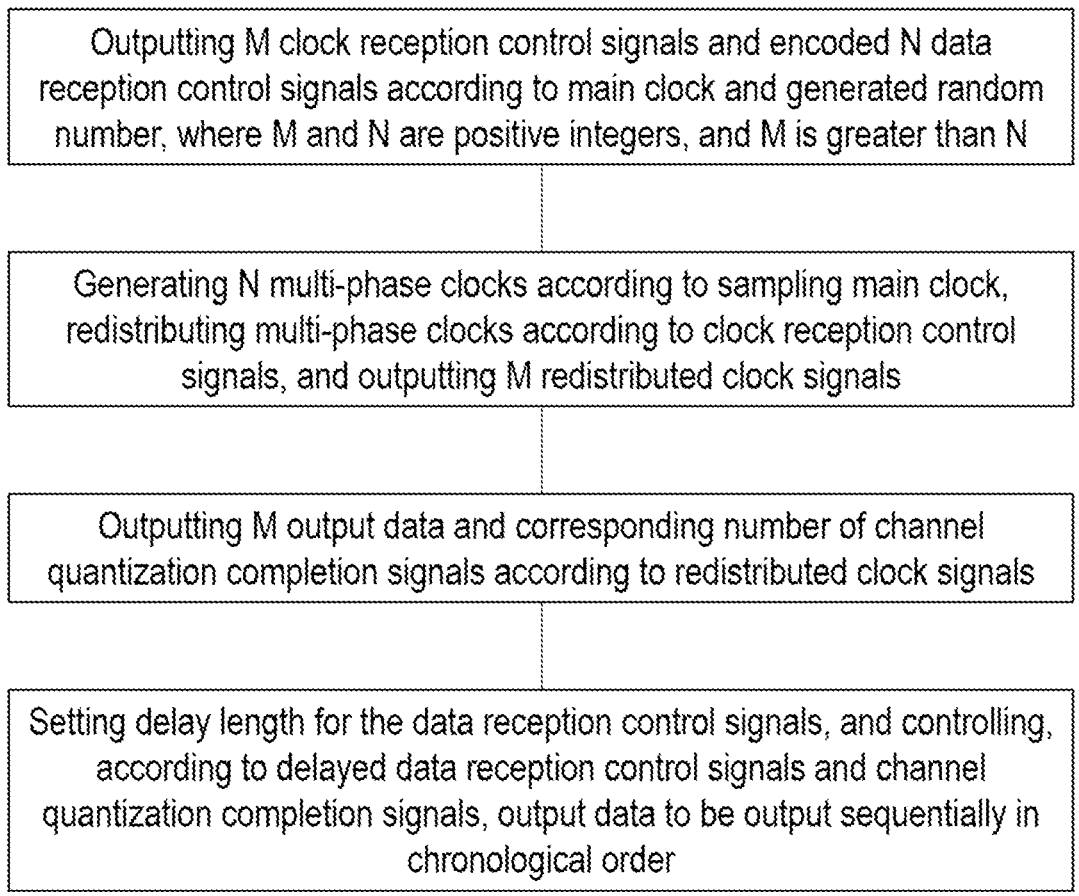
FIG. 14 is a flow chart of a method for channel randomization based on time-interleaved ADC according to exemplary embodiments of the present disclosure.

After completing the circuit construction, random offset values in the range of −500 uV to +500 uV are added to the comparator in each single-channel ADC to simulate mismatches caused by non-ideal factors. The spectrum simulation results with and without randomization turned on are shown in FIG. 13 and FIG. 12, respectively. It can be seen from these two spectrum results that after randomization is turned on, the performance of the original time-interleaved ADC is not affected (ENOB is basically the same), and the spurious-free dynamic range (SFDR) of the time-interleaved ADC has been improved by nearly 10 dB, which fully demonstrates that this technology achieves channel randomization and improves the performance of time-interleaved ADC.

In exemplary embodiments, the present disclosure also provides a method for channel randomization based on time-interleaved ADC for executing the circuit for channel randomization based on time-interleaved ADC, which is described in the foregoing circuit embodiments. Since the technical principles of the method embodiments are similar to those of the foregoing circuit embodiments, the same technical details will not be repeatedly described.

In exemplary embodiments, a method for channel randomization based on time-interleaved ADC includes: outputting M clock reception control signals and encoded N data reception control signals according to a main clock and a generated random number, where M and N are positive integers, and M is greater than N; generating N multi-phase clocks according to a sampling main clock, redistributing the multi-phase clocks according to the clock reception control signals, and outputting M redistributed clock signals; outputting M output data according to the redistributed clock signals and a corresponding number of channel quantization completion signals; setting a delay length for the data reception control signals, and controlling, according to delayed data reception control signals and the channel quantization completion signals, the output data to be output sequentially in a chronological order.

To sum up, circuits and methods for channel randomization based on time-interleaved ADC in exemplary embodiments of the present disclosure may realize channel randomization without affecting the performance of the original time-interleaved ADC and may improve the SFDR of the time-interleaved ADC in the case of mismatch through randomization means. Therefore, the present disclosure may effectively overcome various shortcomings in the conventional technique and may have high industrial utilization value.

As mentioned above, the circuits and methods for channel randomization based on time-interleaved ADC of the present disclosure may have the following beneficial effects.

The introduction of delay may prevent the AD from receiving the data reception control signal prematurely and thus avoid data from being output untimely. Through channel selection and multi-phase clock distribution, the disrupted ADC output data is controlled to be output sequentially in chronological order, which may effectively improve the SFDR of the time-interleaved ADC.

The above embodiments only illustrate the principles and effects of the present disclosure, but are not intended to limit the present disclosure. Anyone familiar with this technology can modify or change the above embodiments without departing from the spirit and scope of the disclosure. Therefore, all equivalents, modifications, or changes made by those with ordinary knowledge in the technical field without departing from the spirit and technical ideas disclosed in the present disclosure shall still be covered by the claims of the present disclosure.

What is claimed is:

1. A circuit for channel randomization based on time-interleaved ADC, comprising:
   a channel selection module configured to output M clock reception control signals and encoded N data reception control signals according to a main clock and a generated random number, wherein M and N are positive integers, and M is greater than N;
   a multi-phase clock distribution module configured to generate N multi-phase clocks according to a sampling main clock, redistribute the multi-phase clocks according to the clock reception control signals, and output M redistributed clock signals;
   a time-interleaved ADC module configured to output M output data and a corresponding number of channel quantization completion signals according to the redistributed clock signals;
   an adjustable delay module configured to set a delay length for the data reception control signals; and
   a timing distribution control module connected to an output end of the adjustable delay module and an output end of the time-interleaved ADC module, respectively, and configured to control, according to delayed data reception control signals and the channel quantization completion signals, the output data to be output sequentially in chronological order.

2. The circuit for channel randomization based on time-interleaved ADC according to claim 1, wherein the channel selection module includes:
   a pseudo-random number generation circuit configured to receive the main clock and a set of random number output enablement signals and output a set of random number output signals; and
a channel selection circuit configured to receive the random number output signals and the main clock and output the clock reception control signals and the data reception control signals.

3. The circuit for channel randomization based on time-interleaved ADC according to claim 2, wherein the channel selection circuit includes:
a clock status register, wherein the clock status register has N addresses, each address represents a multi-phase clock, and a value stored in each address represents a channel connected by the multi-phase clock of a corresponding address;
a channel status register having M addresses, wherein each address represents a channel, and the value stored in each address represents a multi-phase clock connected by the channel of a corresponding address; and
an idle channel register configured to store a channel that is not connected to any multi-phase clock,
wherein the channel selection circuit is configured to:
determine that the main clock is received;
determine, according to the random number output signals, whether to exchange the channel stored in a currently processed address in the clock status register with the channel stored in the idle channel register;
exchange, by the channel status register, the value stored in the corresponding address according to an exchange result between the clock status register and the idle channel register; and
output a corresponding clock reception control signal according to the value stored in the channel status register, and output the data reception control signal according to the value stored in the clock status register.

4. The circuit for channel randomization based on time-interleaved ADC according to claim 3, wherein the channel selection circuit is configured to:
determine that the random number output signal is at a high level, and perform the exchange of the channel stored in the corresponding address in the clock status register with the channel stored in the idle channel register; and
determine that the random number output signal is at a low level, and not perform the exchange of the channel stored in the corresponding address in the clock status register with the channel stored in the idle channel register.

5. The circuit for channel randomization based on time-interleaved ADC according to claim 3, wherein each of the data reception control signals includes K-bit binary-coded signals, and $2^K$ is greater than or equal to M.

6. The circuit for channel randomization based on time-interleaved ADC according to claim 1, wherein the multi-phase clock distribution module includes:
a multi-phase clock generation circuit, wherein the multi-phase clock generation circuit includes N cascaded D flip-flops, an output end of the last D flip-flop is connected to an input end of the first D flip-flop to form a loop, and the output end of each D flip-flops outputs a multi-phase clock corresponding to a different channel; and
a clock redistribution transmission gate array circuit, wherein the clock redistribution transmission gate array circuit includes M output ends, each of the M output ends includes M transmission switches connected in parallel, each of the M transmission switches includes an input end, an output end, and a control end, the input end of the transmission switch receives one of the multi-phase clocks as input, the control end of the transmission switch receives one bit of the clock reception control signal of the corresponding channel.

7. The circuit for channel randomization based on time-interleaved ADC according to claim 6, wherein the transmission switch includes:
a transmission gate, wherein the transmission gate includes a PMOSFET and an NMOSFET, a source of the PMOSFET and a source of the NMOSFET are short-circuited as an input end of the transmission gate, a drain of the PMOSFET and a drain of the NMOSFET are short-circuited as an output end of the transmission gate, and a gate of the NMOSFET serves as a control end of the transmission gate to receive the clock reception control signal; and
an inverter, wherein an input end of the inverter receives the clock reception control signal, and a gate of the PMOSFET is connected to an output end of the inverter.

8. The circuit for channel randomization based on time-interleaved ADC according to claim 1, wherein the time-interleaved ADC module includes M time-interleaved ADC circuits, each of the M time-interleaved ADC circuits is configured to output the output data and the channel quantization completion signal of one channel, wherein the time-interleaved ADC module is configured to:
determine that the redistributed clock signal input to a current time-interleaved ADC circuit is at a high level; and
determine that the channel quantization completion signal of the current time-interleaved ADC circuit is at a low level and that the current time-interleaved ADC circuit has not completed quantization, and
determine that the channel quantization completion signal of the current time-interleaved ADC circuit is at a high level and that the current time-interleaved ADC circuit has completed quantization.

9. The circuit for channel randomization based on time-interleaved ADC according to claim 1, wherein
the adjustable delay module includes a plurality of delay units,
each input signal is connected to one of the delay units,
the delay unit includes: a first inverter, a second inverter, S delay control NMOSFETs, and S delay capacitors, where S corresponds to the number of bits of a delay control word input to the delay unit,
an output end of the first inverter is connected to an input end of the second inverter, an output end of the second inverter serves as an output end of a corresponding delay unit,
an input end of the first inverter serves as an input end of the corresponding delay unit,
the delay control NMOSFETs are connected in parallel, and a drain of each delay control NMOSFET is connected to a connection path between the output end of the first inverter and the input end of the second inverter through a delay capacitor, and
a gate of each delay control NMOSFET is connected to one bit of the delay control word.

10. The circuit for channel randomization based on time-interleaved ADC according to claim 1, wherein the timing distribution control module includes:

a channel addressing decoder circuit configured to decode the delayed data reception control signals into thermometer code signals with M bits;

a data redistribution transmission gate array circuit configured to output redistributed output data and redistributed channel quantization completion signals according to decoded data reception control signals, the output data of the time-interleaved ADC module, and the channel quantization completion signals; and a data outputting D flip-flop circuit configured to use the redistributed output data as input and use the redistributed channel quantization completion signals as clock to output reordered output data.

11. The circuit for channel randomization based on time-interleaved ADC according to claim 10, wherein the data redistribution transmission gate array circuit includes an array of transmission switches, and the transmission switch includes an input end, an output end, and a control end, each input signal corresponds to a transmission switch, each data bit of the output data of each time-interleaved ADC module is connected to the input end of a transmission switch, each decoded data reception control signal is connected to the control ends of R transmission switches, where R is the number of bits of the output data, each channel quantization completion signal of the time-interleaved ADC module is connected to the input end of a transmission switch, and each decoded data reception control signal is connected to the control end of a corresponding transmission switch, and the output end of the transmission switch outputs the redistributed output data or the redistributed channel quantization completion signal.

12. The circuit for channel randomization based on time-interleaved ADC according to claim 10, wherein the data outputting D flip-flop circuit includes N groups of flip-flop arrays, each group of flip-flop arrays includes R D flip-flops, an input end of each D flip-flop receives one bit of the redistributed output data as input, each group of the flip-flop array receives a redistributed channel quantization completion signal as input of a clock end, and an output end of each group of the flip-flop array outputs the reordered output data.

13. The circuit for channel randomization based on time-interleaved ADC according to claim 1, wherein the main clock and the sampling main clock have the same frequency, or the frequency of the main clock is one X-th of the sampling main clock, and X and the number of remaining channels after redundant channels are removed are coprime, where X is a positive integer.

14. A method for channel randomization based on time-interleaved ADC, comprising:

outputting M clock reception control signals and encoded N data reception control signals according to a main clock and a generated random number, where M and N are positive integers, and M is greater than N;

generating N multi-phase clocks according to a sampling main clock, redistributing the multi-phase clocks according to the clock reception control signals, and outputting M redistributed clock signals;

outputting M output data and a corresponding number of channel quantization completion signals according to the redistributed clock signals; and setting a delay length for the data reception control signals, and controlling, according to delayed data reception control signals and the channel quantization completion signals, the output data to be output sequentially in chronological order.

* * * * *